(12) United States Patent
Kurosawa (10) Patent No.: US 6,798,306 B2
(45) Date of Patent: Sep. 28, 2004

(54) HIGH-FREQUENCY OSCILLATION CIRCUIT AND MEASURING DEVICE

(75) Inventor: Shigeru Kurosawa, Tsuchiura (JP)

(73) Assignee: Secretary of Agency of Industrial Science and Technology, Tokyo (JP)

( * ) Notice: Subject to any disclaimer, the term of this patent is extended or adjusted under 35 U.S.C. 154(b) by 0 days.

(21) Appl. No.: 09/739,812

(22) Filed: Dec. 20, 2000

(65) Prior Publication Data

US 2002/0075089 A1 Jun. 20, 2002

(30) Foreign Application Priority Data

Feb. 9, 2000 (JP) ........................................ 2000-031513
Apr. 5, 2000 (JP) ........................................ 2000-103709

(51) Int. Cl.⁷ .............................................. H03B 5/32
(52) U.S. Cl. .................. 331/158; 331/116 R; 310/338; 310/311; 310/316.01; 73/702; 73/514.34; 73/514.13; 324/623
(58) Field of Search ............................ 331/116 R, 158, 331/116 FE; 310/338, 311, 316.01; 73/702, 514.34, 514.13; 324/623

(56) References Cited

U.S. PATENT DOCUMENTS

| | | | |
|---|---|---|---|
| 3,676,801 A | 7/1972 | Musa | 331/116 R |
| 3,689,907 A | 9/1972 | Guajardo | 340/602 |
| 3,760,290 A | 9/1973 | Epstein | 331/40 |
| 3,879,992 A | 4/1975 | Bartera | 73/24.01 |
| 4,321,562 A | 3/1982 | Igarashi | 331/116 FE |
| 4,735,081 A | 4/1988 | Luoma et al. | 73/24.06 |
| 4,862,114 A | 8/1989 | Kleinberg | 331/158 |
| 5,197,028 A | 3/1993 | Nakai | 365/185.21 |
| 5,801,596 A * | 9/1998 | Sakurai | 331/176 |

FOREIGN PATENT DOCUMENTS

| | | |
|---|---|---|
| JP | A3165236 | 7/1991 |
| JP | 05-273106 A | 10/1993 |
| JP | 7-131249 A | 5/1995 |

OTHER PUBLICATIONS

Application note AN–88, "CMOS Linear Applications" 1986 Linear Applications Databook National Semiconductor Corporation Santa Clara, CA, USA.

"Encyclopedia of Electronic Circuits, vol. 1", R.F. Graf, Tab Books,p. 175, 1985.

Electronic Circuit Parts Utilization Handbook, p. 67, by CQ Publishing Co., issued on Nov. 1, 1985.

* cited by examiner

Primary Examiner—Arnold Kinkead
(74) Attorney, Agent, or Firm—Birch, Stewart, Kolasch & Birch, LLP (57) ABSTRACT

A high-frequency oscillation circuit incorporates a crystal resonator having a natural oscillation frequency in a high-frequency area within a closed circuit including one or more logic elements. Therefore, this circuit copes with an oscillation frequency of 1 MHz to 2 GHz or more in basic oscillation frequency of a crystal resonator and it oscillates with stability at the basic oscillation frequency of the crystal resonator.

13 Claims, 11 Drawing Sheets

IC1 IC2 IC3: 74HC00   X2: 100MHz crystal oscillator
R1: 300Ω   C2: 1pF   R2: 300Ω   C3: 100pF

*Fig. 1(a)*

| IC1 IC2 IC3: 74LS00 | X1 : 50MHz crystal oscillator |
| C1: 10pF  R1: 470Ω | C2 : 7pF |
| R2 : 330Ω  C3: 100pF | |

IC1 IC2 IC3: 74HC00     X2: 100MHz crystal oscillator
R1: 300Ω    C2: 1pF    R2: 300Ω    C3: 100pF

155MHz

IC1 IC2: 74HCU04AP    X1: 155MHz crystal oscillator
R1: 500KΩ            C1: 50PF

X2: 100MHz crystal oscillator
IC1 IC2: 74HCU04
R1: 100Ω   C1: 150pF
L1: 0.5μH

IC1 IC2: inverter (74HCU04AP)   X: crystal oscillator
R: 500KΩ    C: 1000PF

HIGH-FREQUENCY OSCILLATION CIRCUIT AND MEASURING DEVICE

FIELD OF THE INVENTION

The present invention relates to a high-frequency oscillation circuit, and more particularly, to a high-frequency oscillation circuit useful for enhancing sensitivity of various measuring instruments used as weight sensor, chemical sensor, biosensor, viscosity sensor, film thickness meter, gas sensor, floating dust sensor, immunity sensor or the like.

BACKGROUND OF THE INVENTION

While recently various measuring instruments using crystal as weight sensor, chemical sensor, biosensor, viscosity sensor, film thickness meter or the like have been numerously developed, it has been needed urgently to develop a high precision and highly sensitive measuring instruments to cope with such a demand for diversity of materials to be detected and precise quantitative determination of materials to be detected.

As is generally known, however, a wafer used for a crystal resonator has such a nature as to cause distortion (piezoelectric effect) when a voltage is applied to thin film electrodes attached to both side faces faces thereof and return to its initial state when the voltage is removed. Because of this nature, a crystal resonator oscillates at a natural frequency determined by its thickness. Thereby, in a crystal wafer, when its thickness varies by adsorbing a substance, a basic frequency (i.e., the natural oscillation frequency or basic oscillation frequency) of the crystal resonator is varied.

The change $\Delta f$ of this natural oscillation frequency is proportionate to a change in thickness. If the change in thickness dimension is replaced by a change $\Delta m$ in mass, the following equation called Sauerbrey's equation can be introduced.

$$\Delta f = -\{2f_0^2/(\rho q \times \mu g)^{1/2}\} \times (\Delta m/A)$$

wherein $f_0$ is a basic oscillation frequency, $\rho g$ and $\mu g$ are density and elastic modulus of the crystal, respectively, and A is the area of a portion performing piezo-electric response.

From this equation, it is understood that, since the sensitivity $\Delta f$ is proportionate to the square of the basic oscillation frequency $f_0$, it is desirable to use a crystal resonator whose $f_0$ is great. However, if $f_0$ becomes too great, the thickness is reduced, and the oscillator tends to be easily broken. Therefore, it is general to use a crystal resonator whose $f_0$ is between 5 and 10 MHz under the normal atmosphere, and even in a solution, merely a crystal resonator whose greatest oscillation frequency $f_0$ is 30 MHz is used, and a measurement exceeding the maximum detection limit of a general-purpose crystal resonator has not yet been attained.

While there is also an example of measurement using the seventh order overtone mode (63 MHz) of a crystal resonator whose $f_0$ is 9 MHz, its detection limit is reported as 0.1 ng, which showed no remarkable improvement in sensitivity, compared with the conventional method of 1 ng ("The Latest Method of Separation, Purification and Detection", p. 441, by NTS Publishing Co., issued May 26, 1997).

On the other hand, in contrast with such a situation as above, there is also proposed a high-frequency oscillation circuit using a crystal resonator not as a weight sensor but for controlling the frequency of an oscillation circuit.

However, in many cases these circuits were analog circuits which are complicated and hard-to-adjust as numerous parts such as transistor, coupling transformer, inductance, etc., are used, and were expensive and not suitable to be used as a measuring instrument for various sensors.

A low-frequency oscillation circuits using a logic element in part is known (JP-A-3-165236 ("JP-A" means unexamined published Japanese patent application), "The Electronic Circuit Parts Utilization Handbook", p.67, by CQ Publishing Co., issued on Nov. 1, 1985). This oscillation circuits, however, use only an oscillator having a natural frequency in a low-frequency area, so that it cannot cope with a demand for higher sensitivity, making it hard to realize a high-frequency oscillation circuit showing high-frequency stability. Furthermore, there was a need to design and constitute an oscillation circuit to suit a crystal resonator to be oscillated and its frequency (Japanese patent application No. 2000-31513).

SUMMARY OF THE INVENTION

The present invention overturns common knowledge of a conventional oscillation circuit.

The present invention aims to provide a high-frequency oscillation circuit which can keep a stable high-frequency oscillation to easily cope with the natural oscillation frequency of a crystal resonator as a sensor even if it becomes high, and yet which can be easily manufactured at a low cost.

Other and further objects, features, and advantages of the invention will appear more fully from the following description, take in connection with the accompanying drawings.

DETAILED DESCRIPTION OF THE INVENTION

Studying hard to solve the foregoing problems, the inventor used a readily available logic element, made a closed circuit by connecting its input and output with a capacitor, a resistor and a crystal resonator having a natural oscillation frequency in a high-frequency area, and discovered that an oscillation circuit capable of keeping a more stable high-frequency oscillation can be unexpectedly obtained by the operation time or response speed of the logic element, the time constant of the capacitor and the resistor or the like, resulting in completion of the present invention.

The present invention provides a high-frequency oscillation circuit characterized by incorporating a crystal resonator having a natural oscillation frequency (i.e., basic oscillation frequency) in a high-frequency area into a closed circuit including a logic element.

In the present invention, a closed circuit is formed by using a logic element. It is possible to use a readily available logic element such as NAND circuit, NOR circuit, inverter or the like which is heretofore publicly known, but it is preferable to use a high-speed TTL (Transistor-Transistor Logic) element or CMOS (Complementary Metal Oxide Semiconductor) element so as to cope with a high-frequency oscillation. Also, in a high-frequency oscillation circuit into which a crystal resonator having a basic oscillation frequency in a high-frequency area is incorporated, it is possible to use a logic element CMOS, which is fast in the response speed, so as to cope with the high frequency.

As a crystal resonator having a natural oscillation frequency in a high-frequency area, a crystal resonator having a natural oscillation frequency corresponding to the oscillation frequency of the circuit generally between 30 and 1800 MHz, preferably between 50 and 1800 MHz, more preferably between 100 and 1800 MHz, and the most preferably between 150 and 1800 MHz can be given. As another crystal resonator for high frequency, a crystal rsonator having a basic oscillation frequency corresponding to an oscillation frequency generally between 1 MHz and 2 GHz, preferably of 150 MHz or more can be given as an example.

In the high-frequency oscillation circuit relative to the present invention, it is possible to incorporate a crystal resonator having a basic oscillation frequency in a high-frequency area into a closed circuit including a high-frequency CMOS as a logic element. This oscillation circuit has quite a novel circuit content and circuit constitution of a type that could not be anticipated or expected by the conventional electronic circuit. Such a high-frequency oscillation circuit as this is suited for oscillation of an oscillator, particularly a crystal resonator for chemical measurement.

The closed circuit in the present invention can be formed by connecting a capacitor, a resistor and a crystal resonator having a natural oscillation frequency in a high-frequency area to the input and output of such a logic element, and properly adjusting an operation time or response speed of the logic element, the natural oscillation frequency of the crystal resonator, and the time constant or the like of the capacitor and resistor.

As a concrete circuit constitution of the closed circuit, such an embodiment as one using, for example, two NANDs or one inverter can be given. However, in view of a sustained oscillation property of a stable high oscillation frequency, an embodiment to select a high-speed TTL or CMOS to suit the natural oscillation frequency in a high-frequency area of the crystal resonator incorporated into the closed circuit, or an embodiment to select a logic element CMOS having a response speed capable of coping with the basic oscillation frequency in the high-frequency area is preferable.

As another preferable embodiment of the present invention, the following embodiments can be mentioned.

(1) A high-frequency oscillation circuit having high-frequency stability, which comprises a crystal resonator for high frequency disposed within a closed circuit that is formed with a logic element, and (2) A high-frequency oscillation circuit, which comprises a crystal resonator having a basic oscillation frequency in a high frequency area, in a closed circuit that is formed so as to connect the input and output of a logic element.

PREFERRED EMBODIMENTS OF THE INVENTION

In the following, the present invention is described in more detail, but the invention is not limited thereto.
Embodiments 1

Figure 1A:
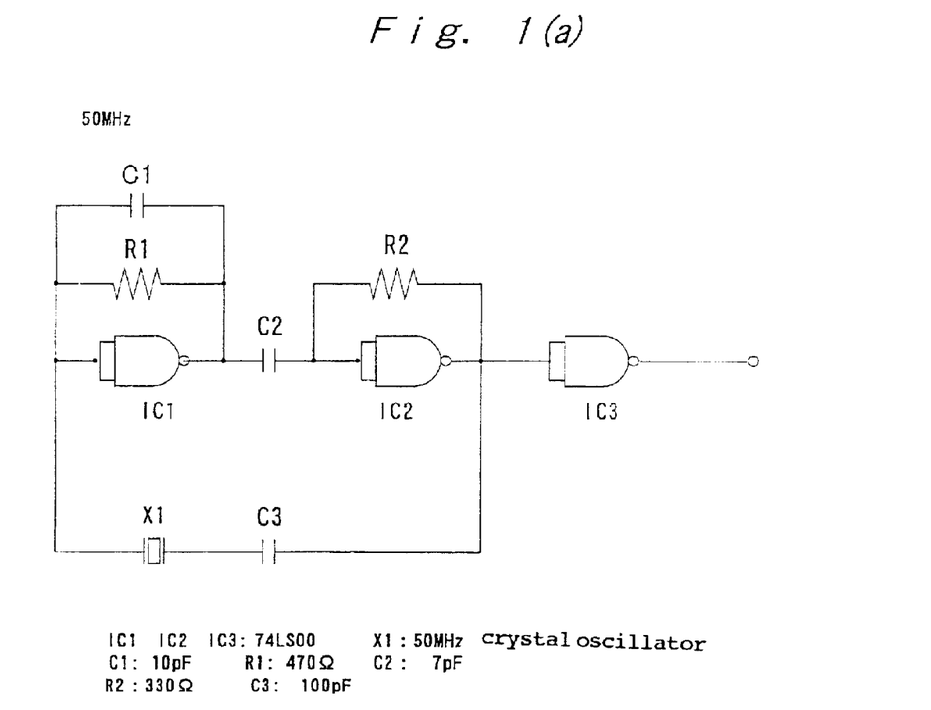
FIG. 1(a) is a diagram showing an embodiment of a high-frequency oscillation circuit using a logic element "NAND" and a crystal resonator having a basic oscillation frequency of 50 MHz.
Figure 1B:
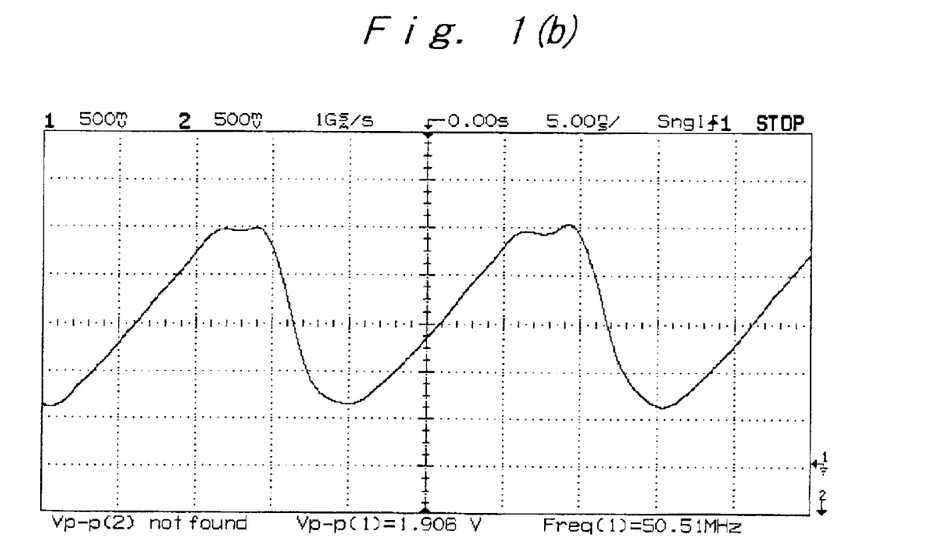
FIG. 1(b) is a graph showing an oscillation waveform of the circuit in FIG. 1(a).
Figure 2A:
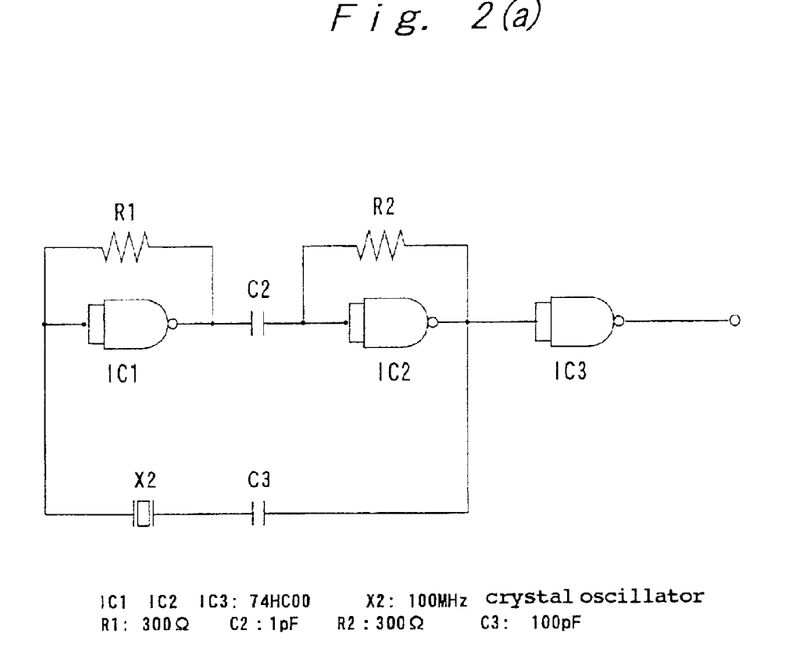
FIG. 2(a) is a diagram showing an embodiment of a high-frequency oscillation circuit using a logic element "NAND" and a crystal resonator having a basic oscillation frequency of 100 MHz.
Figure 2B:
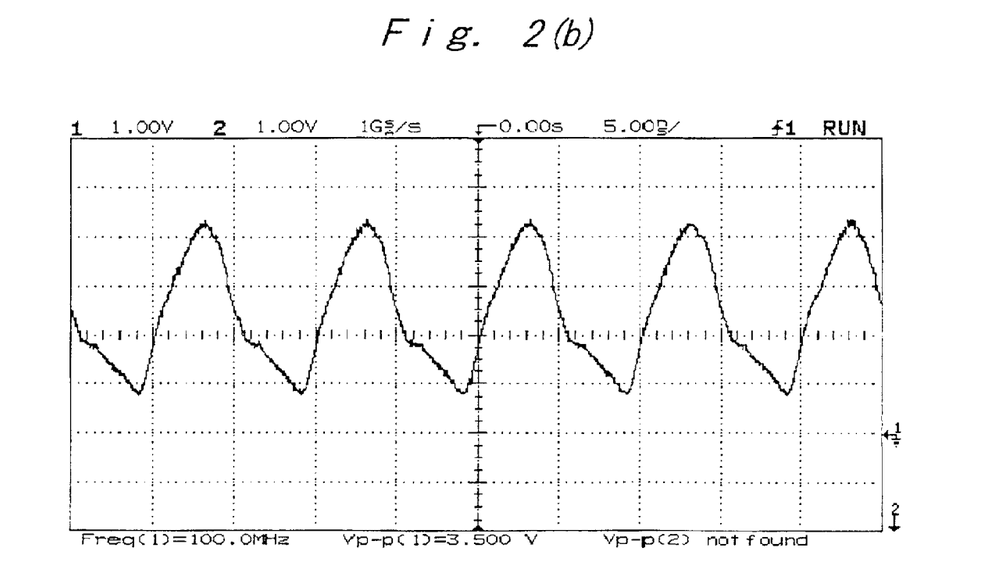
FIG. 2(b) is a graph showing an oscillation waveform of the circuit in FIG. 2(a).

The high-frequency oscillation circuits, in case a logic element NAND is used, are shown in FIGS. 1 and 2, respectively. FIG. 1(a) shows an example of an oscillation circuit when a crystal resonator X1 for a basic frequency of 50 MHz is used; FIG. 1(b) shows an oscillation waveform of the same circuit as measured by using an oscilloscope. FIG. 2(a) shows an example of an oscillation circuit when an overtone (oscillation frequency of a sub-oscillation) crystal resonator X2 in the 3rd or 5th order of 100 MHz is used; FIG. 2(b) shows an oscillation waveform of the same circuit as measured by using an oscilloscope.

In FIG. 1(a) and FIG. 2(a), IC1–IC3 are NANDs as logic elements, X1 is a crystal resonator having a basic oscillation frequency of 50 MHz, X2 is a crystal resonator having a basic oscillation frequency of 100 MHz, C1–C3 are capacitors, and R1–R2 are resistors.

Each closed circuit is constituted by connecting the output of the logic element IC1 to the input of IC2, and connecting the output of IC2 to the input of IC1. IC3 is a buffer for taking out the output of the oscillation circuit to the outside. In each of closed circuits a crystal resonator X1 or X2 is disposed. The impedance of each of the crystal resonators X1 and X2 becomes the lowest at their natural oscillation frequencies (i.e., basic oscillation frequencies).

Consequently, in each oscillation circuit, each capacitor C and each resistor R are set at such a value as the circuit impedance has the lowest value where the impedance of the crystal resonators X1 or X2 is the lowest, in view of the operating speed of the logic element IC.

The values of the above circuit components (parts) and the names of the logic elements are shown in FIG. 1(a) and FIG. 2(a), respectively. In FIG. 1(a), the type of the logic elements IC1, IC2 and IC3 are 74LS00; C1 is 10 pF; C2 is 7 pF; C3 is 100 pF; R1 is 470 Ω; and R2 is 330 Ω. In FIG. 2(a), the type of the logic elements IC1, IC2 and IC3 are 74HC00; C2 is 1 pF; C3 is 100 pF; R1 and R2 are 300 Ω.

However, such values of the circuit parts and names of the logic elements are not absolute, and since the impedance of the circuit is low enough in their vicinities, the circuit will oscillate at the natural oscillation frequencies of the crystal resonators X1 or X2.

As are clear from FIG. 1(b) and FIG. 2(b), in each of the oscillation circuits shown in FIGS. 1 and 2, the waveform at the above circuit constants takes a substantially pure sine wave and can be measured accurately enough by an ordinary frequency counter.

Embodiments 2

Figure 3A:
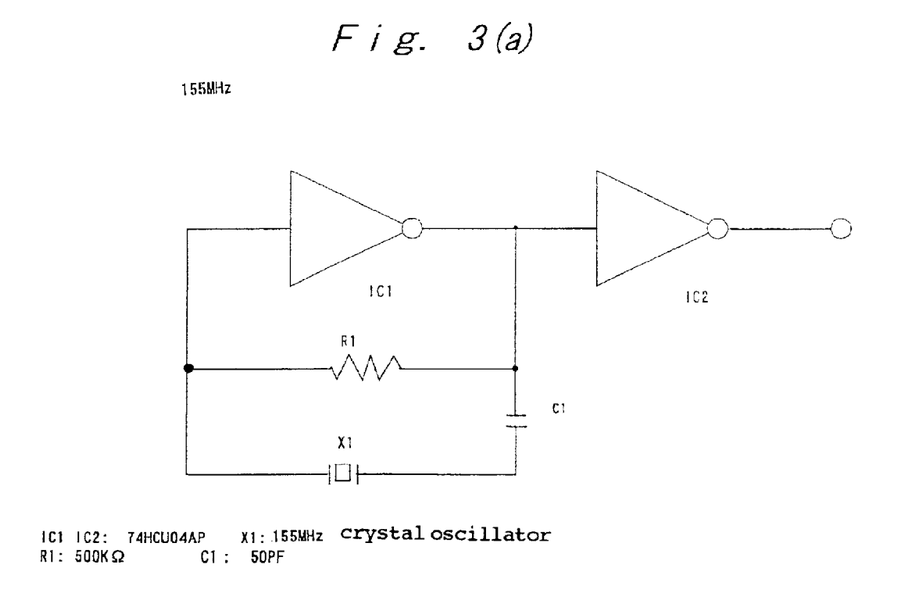
FIG. 3(a) is a diagram showing an embodiment of a high-frequency oscillation circuit using a logic element "inverter" and a crystal resonator having a basic oscillation frequency of 155 MHz.
Figure 3B:
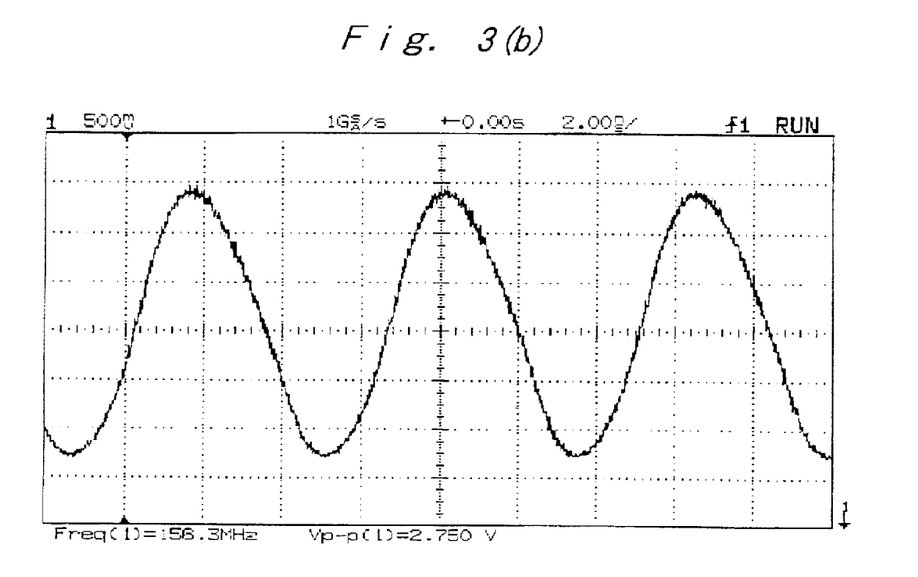
FIG. 3(b) is a graph showing an oscillation waveform of the circuit in FIG. 3(a).
Figure 4A:
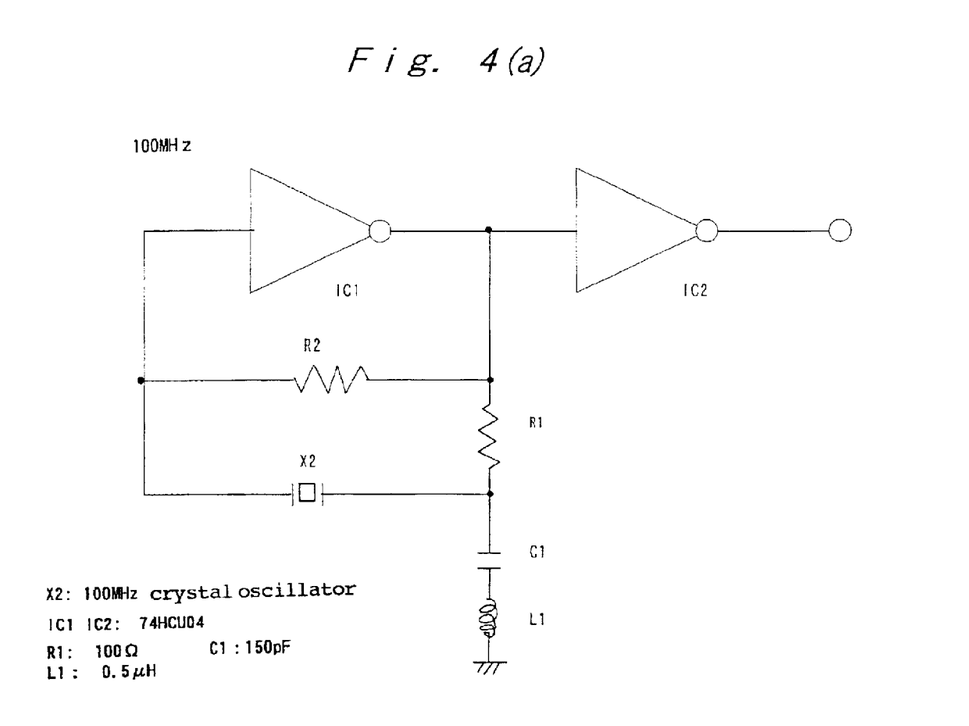
FIG. 4(a) is a diagram showing an embodiment of a high-frequency oscillation circuit using a logic element "inverter" and an overtone crystal resonator of 100 MHz.
Figure 4B:
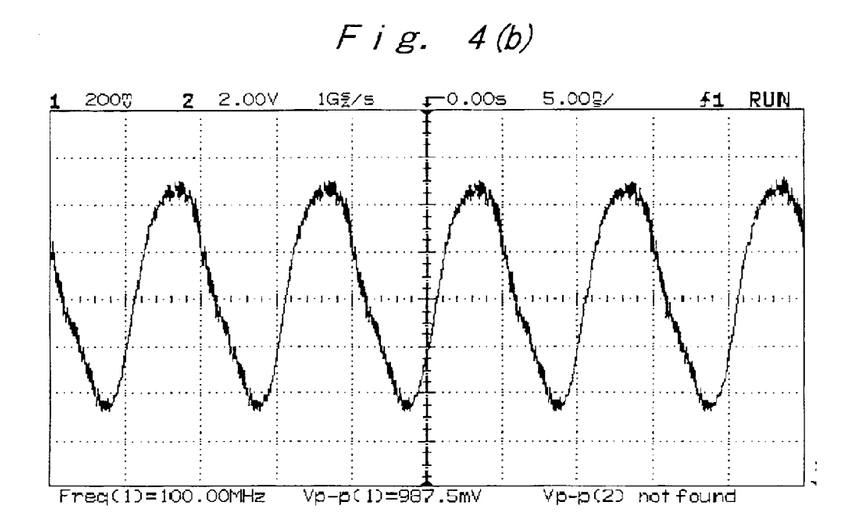
FIG. 4(b) is a graph showing an oscillation waveform of the circuit in FIG. 4(a).

Next, oscillation circuits, in case an inverter is used as a logic element, are shown in FIGS. 3 and 4, respectively. FIG. 3 shows an example of using a crystal resonator X1 having a basic oscillation frequency of 155 MHz. FIG. 4 shows an example of using an overtone crystal resonator X2 in the 3rd or 5th of 100 MHz.

Each symbol is the same as in Embodiments 1. The logic element IC is an inverter and L1 is an inductance. Also, IC2 is a buffer to take out the output of the oscillation circuit outside. In each oscillation circuit, a closed circuit is constituted by connecting the input and output of the inverter IC1. The crystal resonator X1 or X2 is disposed in this closed circuit. The impedance of each of the crystal resonators X1 and X2 becomes the lowest at their natural oscillation frequencies. Consequently, each oscillation circuit oscillates at the natural oscillation frequency of the crystal resonator X1 or X2.

FIG. 3(a) shows an example of a circuit which excites the optimum oscillation at the basic oscillation frequency of the crystal resonator X1. The basic oscillation frequency of the crystal resonator X1 in this example is 155 MHz. The values of the capacitor C1 and the resistor R1 which are concrete circuit parts as well as the name of the logic element IC are shown in the drawing.

FIG. 4(a) shows an example of a circuit which oscillates the most favorably at each overtone. C1 and L1 are for selecting a desired order. The drawings show the value of the circuit parts and the name of the logic element in case the circuit is oscillated at the natural oscillation frequency of 100 MHz by using the 5th order (or 3rd order of 33 MHz) of the crystal resonator X2 having the basic oscillation frequency of 20 MHz.

In FIG. 3(a), the type of the logic elements IC1 and IC2 are 74HCU04AP; C1 is 50 pF; R1 is 500 kΩ; and L1 is 0.5 μH. In FIG. 4(a), the type of the logic elements IC1 and IC2 are 74HCU04; C1 is 150 pF; R1 is 100 Ω; and L1 is 0.5 μH.

These value of the circuit parts and name of logic element are not definite, but it is the same as in case of Embodiments 1 in that, if a value is in the vicinity, the impedance of the circuit is low enough, so the circuit will oscillate at the natural oscillation frequency of the crystal resonator X1 or X2.

As are clear from FIG. 3(b) and FIG. 4(b), in each of the oscillation circuits, the waveforms at the above circuit constant show a substantially pure sine wave, and the frequency can be measured accurately enough by an ordinary frequency counter.

Figure 5:
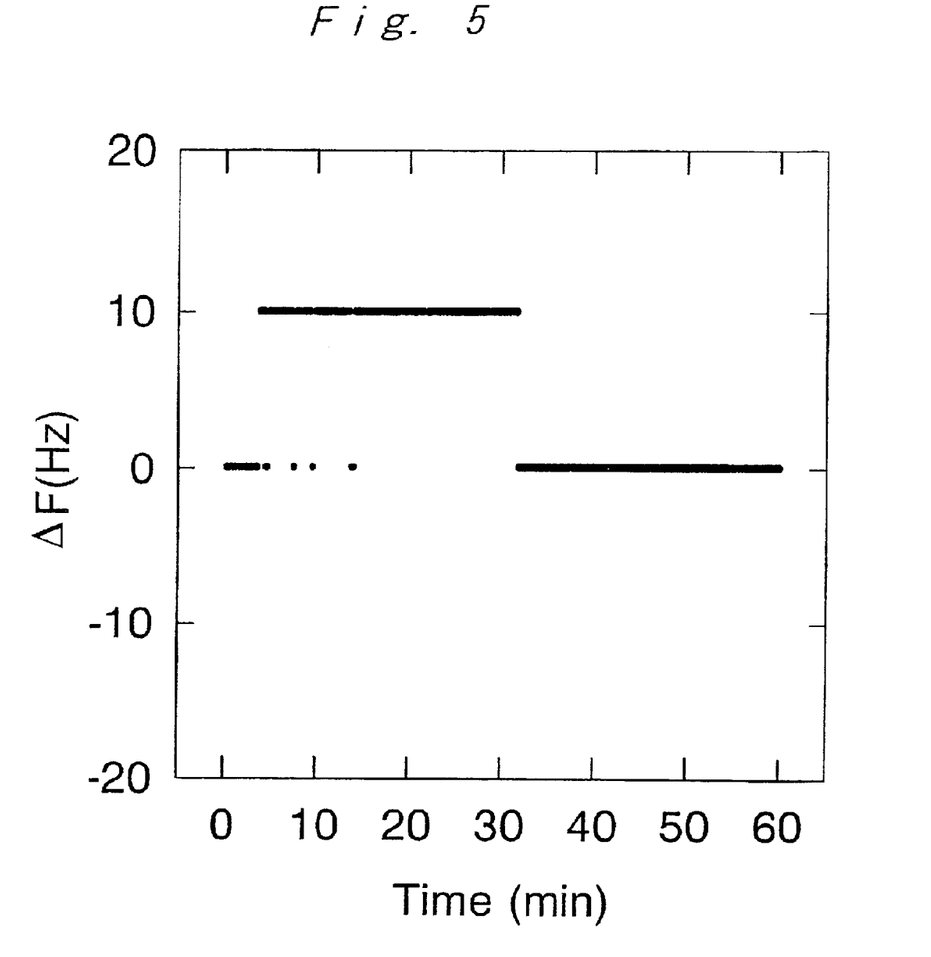
FIG. 5 is a graph showing the stability of an oscillation frequency per hour of the circuit shown in FIG. 2(a) in case of using a normal crystal resonator.
Figure 6:
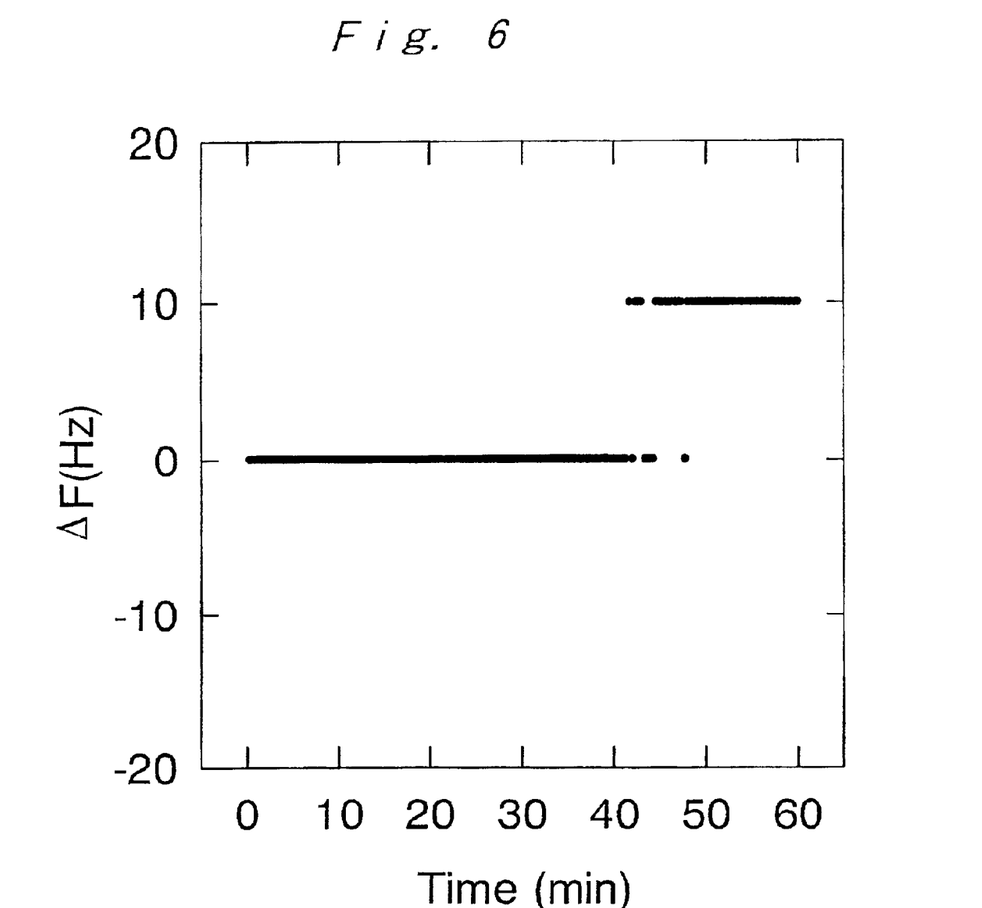
FIG. 6 is a graph showing the stability of an oscillation frequency per hour of the circuit shown in FIG. 2(a) in case of using a crystal resonator on which a styrene film was deposited for one minute by the plasma polymerization method.

FIG. 5 shows the degree of stability of the oscillation frequency in an hour in case of the circuit having the oscillation frequency of 100 MHz using an ordinary crystal resonator, in the Embodiment shown in FIG. 2(a). FIG. 6 shows the degree of stability of the oscillation frequency in an hour in case of the circuit using a crystal resonator on which a styrene film is deposited for one minute by a plasma-polymerization method, in which the circuit having an oscillation frequency of 100 MHz is the same one of the embodiment as shown in FIG. 2(a).

It will be understood from FIG. 5 that, by maintaining constant the temperature of each of oscillation circuits mentioned in Embodiments 1, the variation in oscillation frequency of the circuit per hour is of a value within the range of 10 Hz. Further, as shown in FIG. 6, the variation in oscillation frequency per hour of the circuit using the crystal resonator on which a styrene film is deposited for one minute by plasma polymerization method is also within the range of 10 Hz.

It is also confirmed that each of the circuits in Embodiments 2 shows the same oscillation property of a highly stable high-frequency as in Embodiments 1.

Embodiment 3

Figure 7:
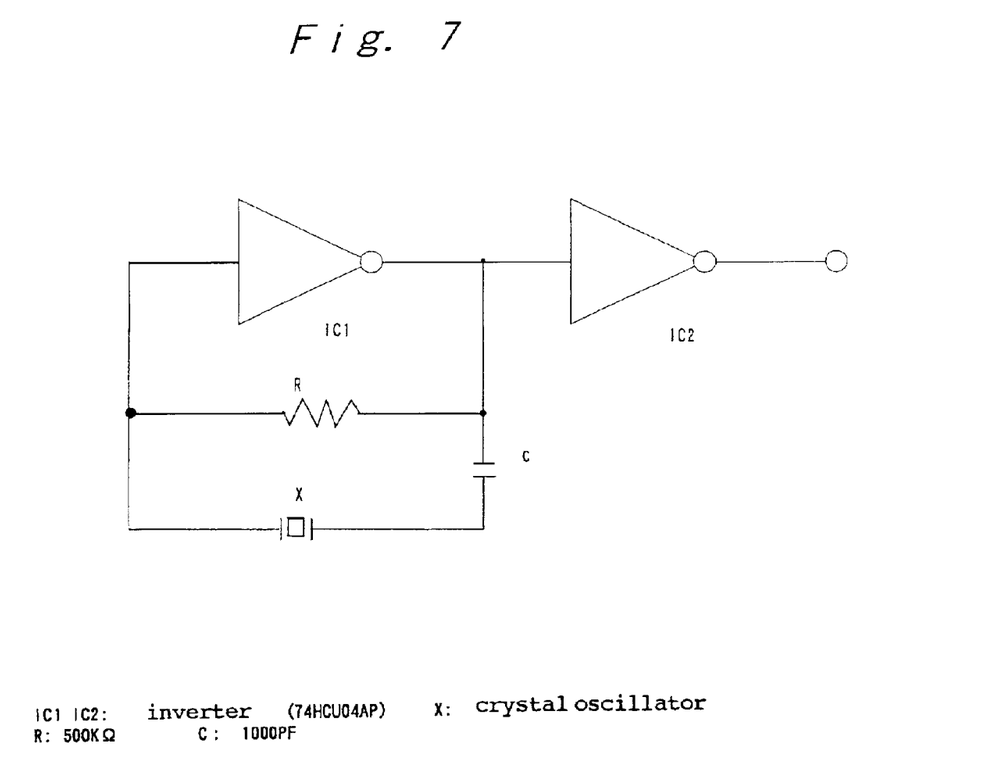
FIG. 7 is a diagram showing another embodiment of the high-frequency oscillation circuit of the present invention.

A high-frequency oscillation circuit using an inverter as a logic element is shown in FIG. 7. FIG. 7 shows an oscillation circuit using a crystal resonator whose basic oscillation frequency is between 20 MHz and 155 MHz.

In FIG. 7, IC1 and IC2 are inverters as logic elements; X is a crystal resonator; C is a capacitor; and R is a resistor. The concrete values of the capacitor C and the resistor R and the name of the logic element IC are shown in the drawing. Further, IC2 is a buffer to take out the output of the oscillation circuit outside.

In this oscillation circuit, a closed circuit is constituted by connecting the input and the output of the inverter IC1. The crystal resonator X is placed in this closed circuit. The impedance of the crystal resonator X becomes the lowest at its basic oscillation frequency. Accordingly, the circuit will oscillate at the natural oscillation frequency of the crystal resonator X. For instance, the oscillation frequency can be 1 to 19 MHz, 20 MHz, 33 MHz, 50 MHz, and 155 MHz in the circuit of FIG. 7.

In FIG. 7, the type of the inverter IC1 and IC2 is 74HCU04AP; R is 500 kΩ; and C is 1000 pF.

The above values of the circuit elements and the names of the logic elements are not restrictive, but, since the impedance of the circuit is low enough in the vicinities, the oscillation circuit oscillates at the basic oscillation frequency of the crystal resonator X. It is desirable to select a logic element CMOS capable of coping with this range of frequency.

Figure 8A:
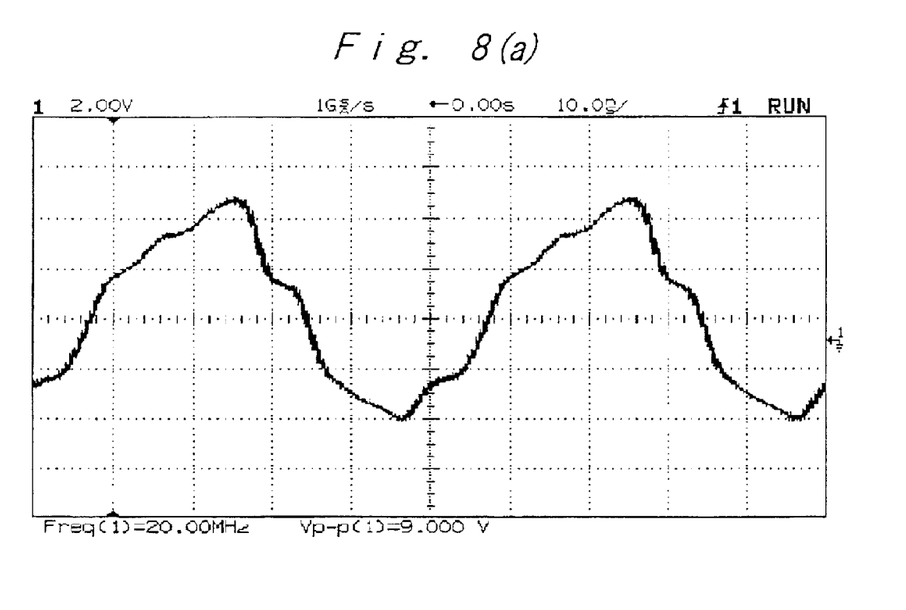
FIG. 8(a) is a graph showing an oscillation waveform measured by oscilloscope in case a crystal resonator having a basic oscillation frequency of 20 MHz is used in the circuit shown in FIG. 7.
Figure 8B:
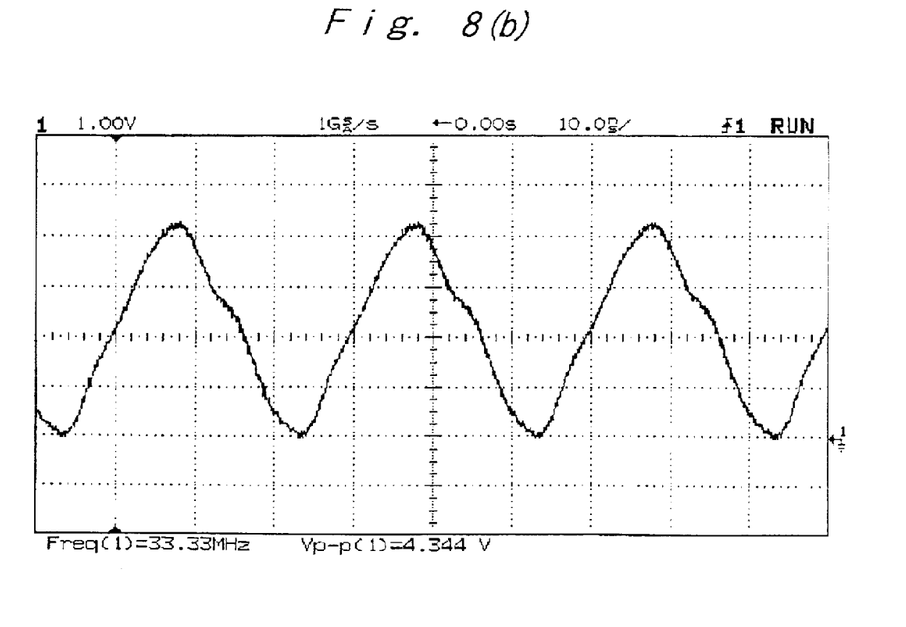
FIG. 8(b) is a graph showing an oscillation waveform measured by oscilloscope in case a crystal resonator having a basic oscillation frequency of 33 MHz is used in the circuit shown in FIG. 7.
Figure 8C:
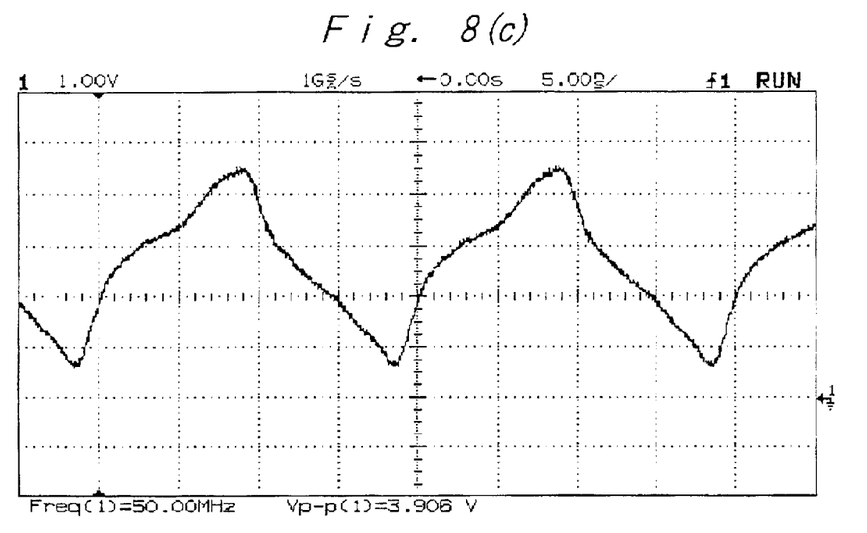
FIG. 8(c) is a graph showing an oscillation waveform measured by oscilloscope in case a crystal resonator with a basic oscillation frequency of 50 MHz is used in the circuit shown in FIG. 7.
Figure 8D:
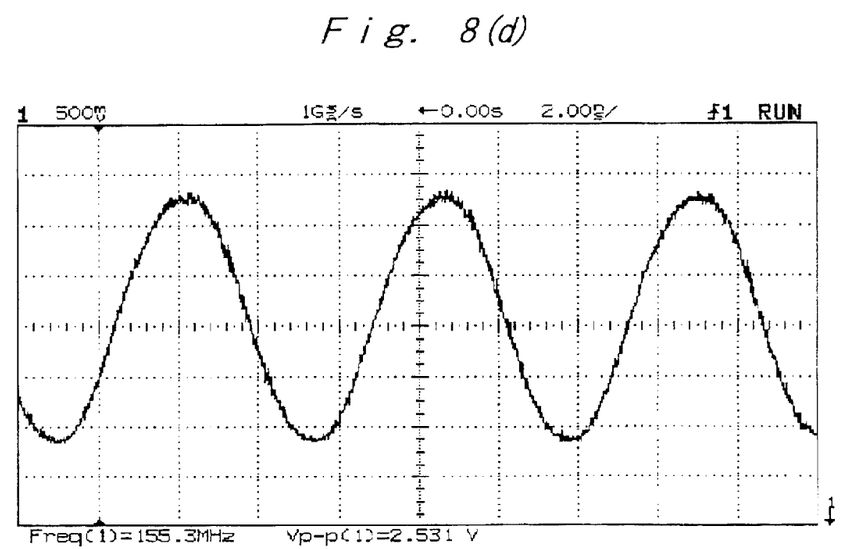
FIG. 8(d) is a graph showing an oscillation waveform measured by oscilloscope in case a crystal resonator having a basic oscillation frequency of 155 MHz is used in the circuit shown in FIG. 7.

FIGS. 8(a), (b), (c) and (d) show output waveforms measured by an oscilloscope in case crystal resonators X having basic oscillation frequencies of 20 MHz, 33 MHz, 50 MHz, and 155 MHz are respectively used in the circuit of FIG. 7. As is clear from each Figure, the output waveform by the above circuit constant has a shape between a rectangular and a sine wave and shows approximately a sine wave at 155 MHz. The oscillation frequency of the oscillation circuit showing these output waveforms can be sufficiently measured by an ordinary frequency counter.

Thus, by selectively using one of crystal resonators X having various basic oscillation frequencies from 1 MHz to 2 GHz, they can be oscillated on the same circuit at the basic oscillation frequency of each crystal resonator. Conventionally, it has been a common knowledge to design and constitute an oscillation circuit the most favorable for each crystal resonator. The present invention overturns the common knowledge regarding conventional oscillation circuits.

Figure 9A:
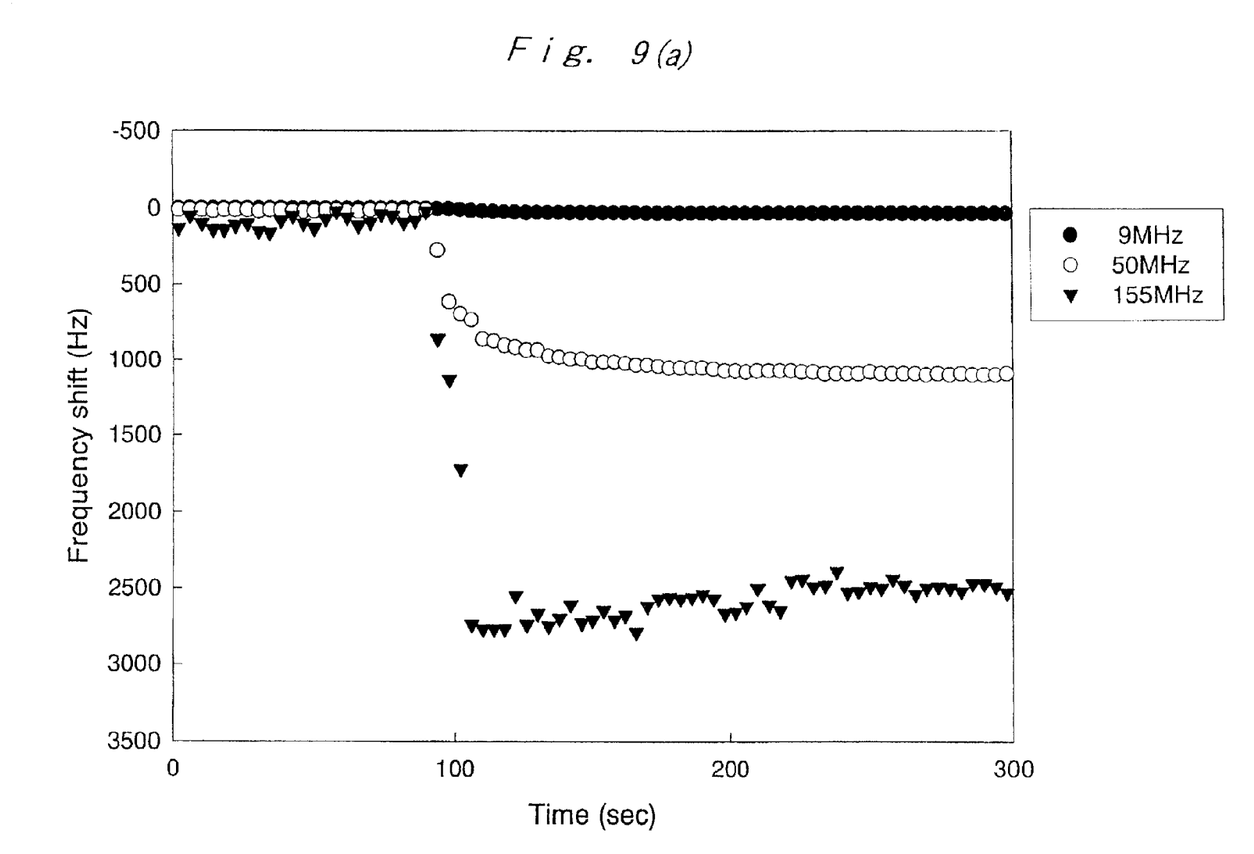
FIG. 9(a) is a graph showing changes in the oscillation frequency with the lapse of time when one of the oscillation circuits of FIG. 7 is used and saturated acetone steam of the same concentration is adsorbed on crystal resonators coated with a plasma polymerized styrene film of the same weight.
Figure 9B:
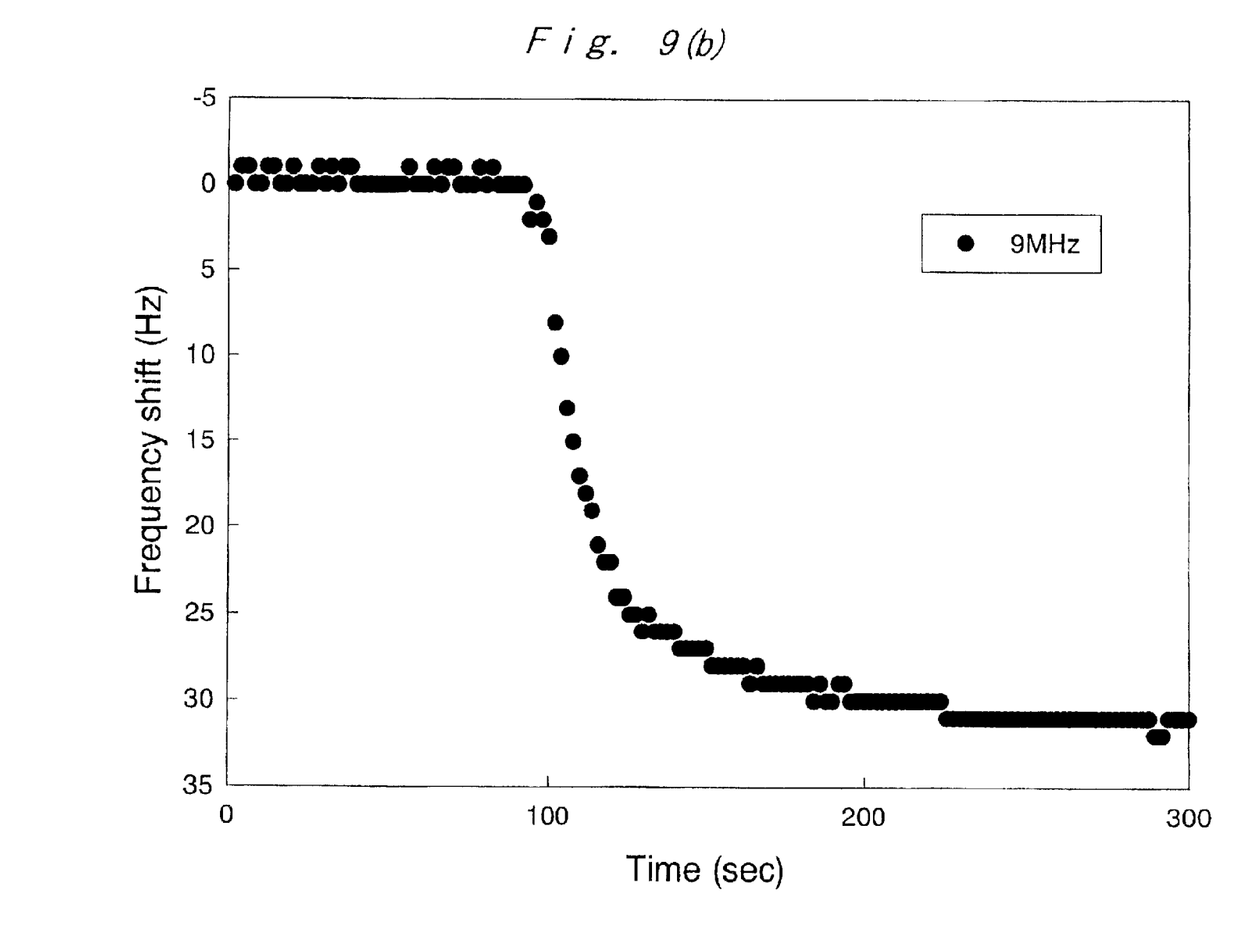
FIG. 9(b) is an enlarged graph of the measurement result by using the crystal resonator having the basic oscillation frequency of 9 MHz in FIG. 9(a).

FIGS. 9(a) and 9(b) show changes in the oscillation frequency with the lapse of time when one of the oscillation circuits of FIG. 7 is used and saturated acetone steam of the same concentration (as measured by extracting 2 ml of head space of the acetone solution and injecting it into a gas adsorption measurement vessel of 1000 ml) is adsorbed on crystal resonators (of 9 MHz, 50 MHz, 155 MHz) coated with a plasma polymerized styrene film of the same weight (subjected to electric discharge output of 100 W, monomer pressure of 100 Pa, and 1 minute of polymerization time).

In FIGS. 9(a) and 9(b), gas adsorption responses are shown, when measured, respectively, by using: (●) a crystal resonator having a basic oscillation frequency of 9 MHz; (○) a crystal resonator having a basic oscillation frequency of 50 MHz; and (▼) a crystal resonator having a basic oscillation frequency of 155 MHz. As the basic oscillation frequencies of the crystal increase, the amount of change in frequency responding to the acetone steam of the same concentration remarkably increases.

In FIGS. 9(a) and 9(b), the average values of gas adsorption at respective frequencies show frequency responses of 30 Hz in case of 9 MHz (●), 1200 Hz in case of 50 MHz (○), and 2500 Hz in case of 155 MHz (▼), respectively. Evidently, the higher the basic oscillation frequency of a crystal resonator used for gas adsorption is, the greater amount of response by gas adsorption is shown.

In the high frequency oscillation circuit shown in FIG. 7, it is not necessary to change the circuit constant in correspondence to the basic oscillation frequency of the crystal resonator to be used. With such an oscillation circuit, it is possible to cope with as it is, even if a crystal resonator as a sensor is changed according to purposes of measurement so as to change a basic frequency, which was heretofore difficult. If such a high-frequency oscillation circuit is used, a precision high-sensitive measuring instrument which is the most favorable for measurement of a super-high sensitive gas sensor or the amount of floating dust can be readily fabricated.

The high-frequency oscillation circuit using the logic elements according to the present invention, though using inexpensive parts and being a simple circuit, continues highly stable oscillation by a crystal resonator having a high natural oscillation frequency.

As a result, the high-frequency oscillation circuit of the present invention enables to measure precisely a delicate change in natural oscillation frequency of a crystal resonator as a sensor, and a use of such a high-frequency oscillation circuit enables to readily fabricate a super-high-sensitive, precision measurement instrument favorable for measurement such as a super-high sensitive weight sensor, a viscosity sensor, and the like.

Having described our invention as related to the present embodiments, it is our intention that the invention not be limited by any of the details of the description, unless otherwise specified, but rather be construed broadly within its spirit and scope as set out in the accompanying claims.

What is claimed is:

1. A high-frequency oscillation circuit comprising:
   a closed loop circuit including at least one logic element, said at least one logic element having an input and an output, wherein said closed loop circuit begins at said output and returns to said output of said at least one logic element, said at least one logic element including a first logic element within said closed loop circuit;
   another logic element external to said closed loop circuit;
   a capacitor being disposed within said closed loop circuit;
   a resistor being disposed within said closed loop circuit; and
   a crystal resonator for high frequency being disposed within said closed loop circuit, said crystal resonator being connected in series with said capacitor and in parallel with said resistor, wherein said crystal resonator is a sensor element for chemical measurement of a predetermined parameter.

2. A measuring instrument for measuring a predetermined parameter, said measuring instrument comprising:
   a closed loop, high frequency oscillation circuit including at least one logic element, said at least one logic element having an input and an output, wherein said closed loop circuit begins at said output and returns to said output of said at least one logic element;
   a capacitor being disposed within said closed loop circuit;
   a resistor being disposed within said closed loop circuit; and
   a sensor for determining said predetermined parameter, wherein said sensor includes a crystal resonator for high frequency being disposed within said closed loop circuit, said crystal resonator being connected in series with said capacitor and in parallel with said resistor and having a natural oscillation frequency, a change in said natural oscillation frequency of said crystal resonator being indicative of said predetermined parameter.

3. The measuring instrument for measuring said predetermined parameter according to claim 2, wherein said predetermined parameter includes at least one of a weight parameter, a viscosity parameter, and a film thickness parameter.

4. The measuring instrument for measuring said predetermined parameter according to claim 2, wherein said sensor is at least one of a weight sensor, a chemical sensor, a biosensor, a viscosity sensor, a film thickness meter, a gas sensor, a floating dust sensor, and an immunity sensor.

5. The measuring instrument for measuring said parameter according to claim 4, said crystal resonator having a basic oscillation frequency of 500 MHz or more.

6. The measuring instrument for measuring said parameter according to claim 4, said crystal resonator having a basic oscillation frequency of between 1 MHz and 500 MHz.

7. The measuring instrument for measuring said parameter according to claim 2, said at least one logic element including a first logic element within said closed loop circuit and another logic element external to said closed loop circuit.

8. The measuring instrument for measuring said parameter according to claim 2, wherein said first logic element includes a high-speed CMOS.

9. The measuring instrument for measuring said parameter according to claim 2, wherein said at least one logic element includes a high-speed TTL or CMOS.

10. The high-frequency oscillation circuit according to claim 1, wherein said first logic element includes an inverter element.

11. The measuring instrument according to claim 2, wherein said at least one logic element includes an inverter element.

12. A high-frequency oscillation circuit comprising:

a primary logic element;

a secondary logic element, wherein said primary and said secondary logic elements are inverters, and said secondary logic element acts as a buffer for outputting an output of the oscillation circuit by connecting to an output of the primary logic element;

a closed circuit connecting an input and an output of the primary logic element, wherein said closed circuit includes a condenser installed in series with crystal resonators showing basic frequencies of 20 MHz to 500 MHz and including a circuit connected to a resistor in parallel with said crystal resonators; and a sensor made of a crystal.

13. The high-frequency oscillation circuit according to claim 12, wherein said crystal sensor utilizes outputted oscillation to sense a parameter.

* * * * *